United States Patent [19]

Howard et al.

[11] 4,310,568
[45] Jan. 12, 1982

[54] METHOD OF FABRICATING IMPROVED SCHOTTKY BARRIER CONTACTS

[75] Inventors: James K. Howard, Fishkill; William D. Rosenberg, Wappingers Falls; James F. White, Newburgh, all of N.Y.

[73] Assignee: International Business Machines Corporation, Armonk, N.Y.

[21] Appl. No.: 960,983

[22] Filed: Nov. 15, 1978

Related U.S. Application Data

[62] Division of Ser. No. 755,272, Dec. 29, 1976, Pat. No. 4,141,020.

[51] Int. Cl.$^3$ ............................................. H01L 29/48
[52] U.S. Cl. .................................. 427/84; 204/192 C; 427/88; 427/91
[58] Field of Search ............... 204/192 C; 427/84, 88, 427/91

[56] References Cited

U.S. PATENT DOCUMENTS

| | | | |
|---|---|---|---|
| 3,652,905 | 3/1972 | Page | 357/15 |
| 3,669,730 | 6/1972 | Lepselter | 357/15 |
| 3,717,563 | 2/1973 | Revitz et al. | 204/192 C |
| 4,009,481 | 2/1977 | Reindl | 357/15 |
| 4,017,890 | 4/1977 | Howard et al. | 357/67 |
| 4,141,020 | 2/1979 | Howard et al. | 357/15 |

*Primary Examiner*—John D. Smith
*Attorney, Agent, or Firm*—Theodore E. Galanthay

[57] ABSTRACT

An aluminum-transition metal Schottky barrier contact, and methods of fabrication thereof are disclosed. In one preferred embodiment, the junction is comprised of an aluminum-tantalum intermetallic layer abutting a silicon substrate. Alternate embodiments utilize an intermetallic compound of a metal selected from the group of tantalum, zirconium, hafnium, niobium, titanium and nickel in combination with aluminum. The preferred embodiments can be fabricated by evaporation of a layer of a metal selected from the above mentioned group followed by evaporation of a layer of aluminum on a silicon substrate, after which an annealing step is utilized which creates the desired intermetallic compound in a layer abutting the silicon surface. Alternatively, the junction can be created by hot or cold sputtering of a preselected intermetallic compound of one of the metals with aluminum directly upon the silicon substrate, followed by deposition of a conductive layer such as aluminum. In the case of cold sputtering an annealing step is required to perfect the desired intermetallic compound structure; and in the case of hot sputtering an annealing step may be useful in perfecting the desired intermetallic structure, although it is not essential. The resulting devices are highly thermally stable with predictable barrier heights; and exhibit excellent electrical properties while they are capable of fabrication with good planarity.

5 Claims, 3 Drawing Figures

METHOD OF FABRICATING IMPROVED SCHOTTKY BARRIER CONTACTS

This is a division of application Ser. No. 755,272 filed Dec. 29, 1976 now U.S. Pat. No. 4,141,020.

BACKGROUND OF THE INVENTION

1. Field of the Invention

The present invention relates to improved Schottky barrier junction devices and methods of fabrication thereof. More particularly, the invention concerns the use of a layer of an intermetallic compound of tantalum, zirconium, hafnium, niobium, titanium or nickel in combination with aluminum upon a semiconductor substrate to form a Schottky barrier contact. The invention also concerns various methods for fabricating such Schottky barrier contacts.

2. Description of the Prior Art

The use of Schottky barrier junctions is well known in the prior art. Thus, a Schottky barrier junction comprises a rectifying metal—semiconductor junction produced by plating, evaporating or sputtering any of a variety of metals upon N-type or P-type semiconductor materials. The more commonly used metals are the electrode metals such as molybdenum, tungsten and aluminum, or aluminum alloy with copper; and the semiconductor most commonly utilized is silicon. The electrical characteristics of such metal to semiconductor junctions are well known to depend upon the work function of the metal as well as the electron affinity of the semiconductor. Moreover, the energy necessary for an average electron to flow in the reverse direction across the barriers is determined largely by the barrier height of the junction, where the barrier height is found to be equal to the difference in work function between the metal and a semiconductor. From this relationship, it follows that an essential requirement of forming a diode junction is that the work function of the metal must exceed the corresponding property of the semiconductor in order that a barrier be present. If this condition is not met an ohmic contact is formed.

In the case of aluminum, tungsten and molybdenum it has been found that Schottky barrier junctions can be formed utilizing N-type silicon having a doping less than $8 \times 10^{16}$ atoms/cc. It is also recognized that other metals, such as hafnium can be utilized with P-type silicon having the above mentioned doping levels to form Schottky barrier junctions. With the usual aluminum-silicon barrier, a barrier height in the order of 0.68–0.72 electron volts is possible where pure metal exists at the junction after the usual settling operation employed for fabricating the devices.

Schottky barrier junctions fabricated in accordance with the foregoing parameters are suitable for many purposes. However, a need exists in the art for a Schottky barrier junction design and method of fabrication thereof of devices having uniform and temperature stable characteristics. In addition, a need exists for a method of fabricating Schottky barrier junctions which have adjustable and highly predictable barrier heights, that at the same time exhibit good electrical characteristics. Finally, a need exists for a method for fabricating such Schottky barrier junctions which produces devices exhibiting good planarity at the useful silicon interface.

It has been found by the inventors of the present application, that Schottky barrier junctions exhibiting the above mentioned desirable characteristics can be fabricated utilizing several different methods by utilizing intermetallic compounds of a certain group of transition metals with aluminum. The use of intermetallic compounds of some of the transition metals with aluminum is disclosed in U.S. patent application Ser. No. 625,439, now U.S. Pat. No. 4,017,890 filed Oct. 24, 1975 for "Intermetallic Layers in Thin Films for Improved Electro Migration Resistance" by James K. Howard and Paul S. Ho, now U.S. Pat. No. 4,017,890. The above mentioned application does not disclose the use of intermetallic compounds in connection with Schottky barrier junctions, however.

SUMMARY OF THE INVENTION

Accordingly, it is an object of the present invention to provide an improved method for manufacturing Schottky barrier junction diodes exhibiting high thermal stability and predictable barrier heights. In addition, the junctions have been found to exhibit excellent electrical properties and are capable of fabrication with good planarity. In one embodiment, a tantalum-aluminum layer is deposited in abutting relationship to a semiconductor substrate. It is preferred that the tantalum-aluminum layer comprise an intermetallic compound of tantalum and aluminum, although such is not absolutely essential. In other embodiments, intermetallic compounds of aluminum with other metals from the group of tantalum, zirconium, hafnium, niobium, titanium and nickel are utilized in the form of a layer abutting the semiconductor surface.

The preferred embodiments can be fabricated by various methods. In one method a layer of metal of the selected type is deposited by evaporation upon the semiconductor surface followed by deposition of a layer of aluminum, again by evaporation, upon the metal surface. An annealing step is then carried out whereby aluminum is diffused through the metal layer; and a layer of an intermetallic compound comprised of the selected metal and aluminum is formed abutting the silicon surface, which layer forms the Schottky barrier contact.

In an alternate method, an intermetallic compound of aluminum and a selected transition metal is utilized as a target in a sputter deposition process whereby a sputtered layer of aluminum-transition metal intermetallic compound is deposited directly upon the semiconductor surface. Following that step, a layer of aluminum is deposited by evaporation upon the intermetallic layer. An annealing step is then carried out. In the event that sputtering is carried out by a cold sputtering technique, the annealing step is essential to perfect the lattice structure of the intermetallic compound. In the event that a hot sputtering technique is utilized for deposition of the aluminum-metal intermetallic compound, then the annealing step will improve or perfect the intermetallic structure, although annealing is not essential.

BRIEF DESCRIPTION OF THE DRAWINGS

These and other features and advantages of the invention will become apparent from the following detailed description taken in conjunction with the accompanying drawings wherein.

DETAILED DESCRIPTION OF THE INVENTION

Figure 1:
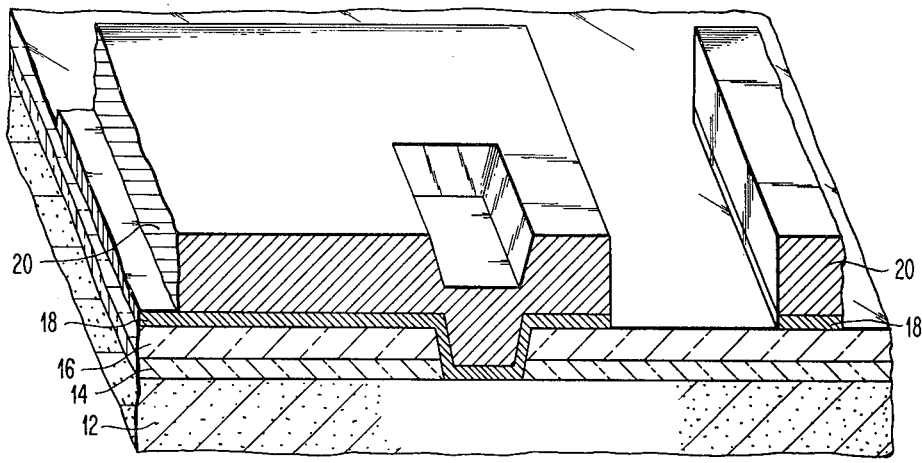
FIG. 1 represents a schematic three-dimensional view of a Schottky barrier junction designed in accordance with the invention.
Figure 2:
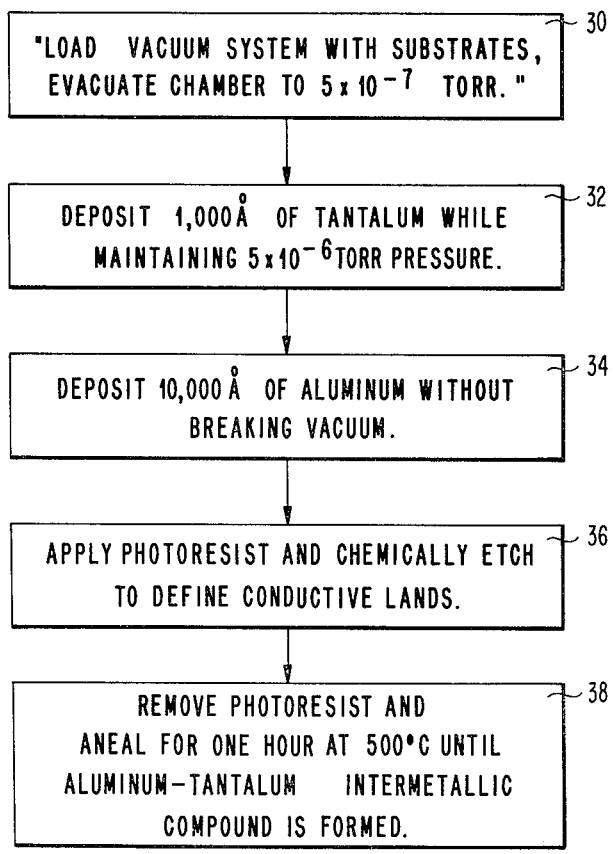
FIG. 2 is a flow diagram illustrating one preferred method for forming the Schottky barrier junction illustrated in FIG. 1.
Figure 3:
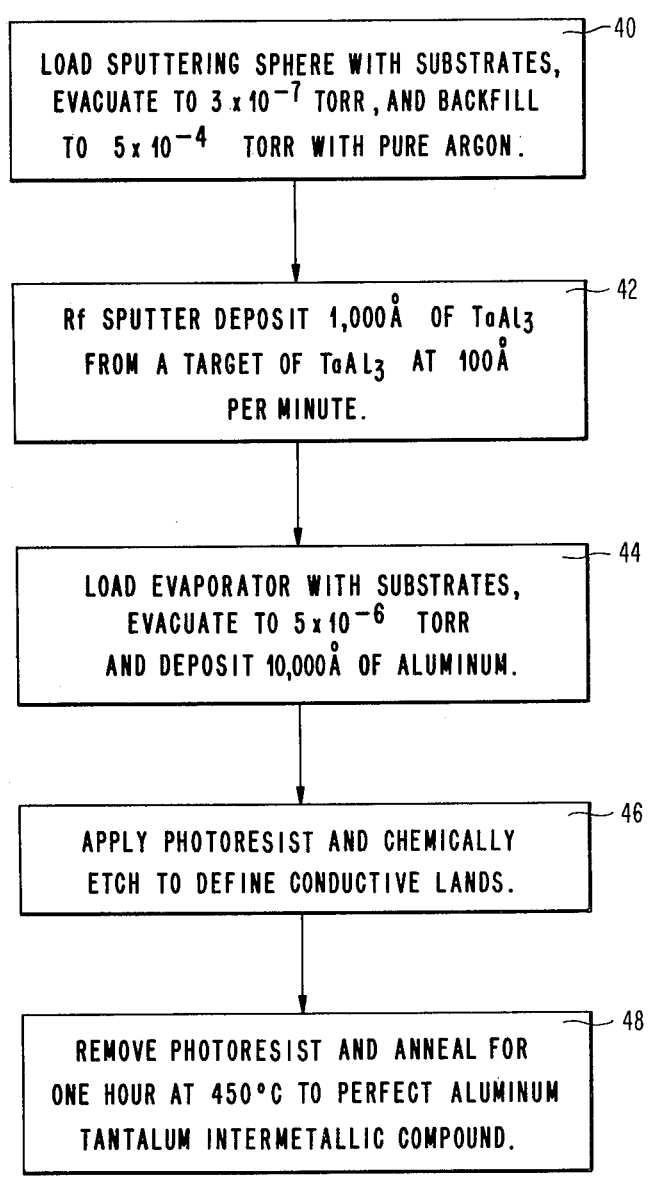
FIG. 3 is a flow diagram illustrating another preferred method for forming the Schottky barrier junction illustrated in FIG. 1.

Other objects, features and advantages of the invention will become apparent from the following description of the preferred embodiments illustrated in FIGS. 1–3, specifically including an aluminum-tantalum intermetallic compound layer abutting a semiconductor surface to form a Schottky barrier contact. In particular, by reference to FIG. 2, one method of fabricating the preferred embodiment will be described after which certain characteristics of the structure exhibited in FIG. 1 will be more readily apparent.

In one preferred embodiment an intermetallic metal compound of aluminum with tantalum was selected. As utilized herein, the term intermetallic compound represents more than a simple mixture in the form of an alloy. Rather, the term refers to a substance composed of atoms of two different elements with definite proportions by atoms of the constituent elements, which may best be represented by a chemical formula. "Elements of Physical Metallurgy" by A. G. Guy, published by Addison-Wesley (1951) on page 89 includes a definition of intermetallic compound as follows:

"Phases whose chemical composition are intermediate between the two pure metals and whose crystal structures are different from those of the pure metals. This difference in crystal structure distinguishes intermediate phases from primary solid solutions, which are based on the pure metal."

"Some intermediate phases can accurately be called intermetallic compounds when, like $Mg_2Pd$, they have a fixed simple ratio of the two kinds of atoms."

TABLE I

| | ASTM Card # (Vol. #1) | Crystal Structure | Reference |
|---|---|---|---|
| $Al_3Hf$ | 17-419 | Tetragonal | Boller et al Monatsh Chem. 91, 1174 (60) |
| $Al_3Ta$ | 2-1128 | Tetragonal | Brauer, Z. Anorg. Chem. 242, 9 (1939) |
| $Al_3Zr$ | 2-1093 | Tetragonal | Brauer, Z. Anorg. Chem. 242, 15 (1939) |
| $Al_3Ti$ | 2-1121 | Tetragonal | Brauer, Z. Anorg. Chem. 242, 4 (1939) |
| $Al_3Ni$ | 2-416 | Orthorhombic | Bradley et al. Phil. Mag 23, 1049 (37) |
| $Al_3Nb$ | 13-146 | Tetragonal | Brauer, Z. Anorg. Chem. 242, 1 (1939) |

TABLE II

| Element | Structure |
|---|---|
| Al | Face Centered Cubic |
| Ta | Body Centered Cubic |
| Hf | Hexagonal Close Pack |
| Zr | Hexagonal Close Pack |
| Ti | Hexagonal Close Pack |
| Nb | Body Centered Cubic |
| Ni | Face Centered Cubic |

Table I included hereinabove gives the intermetallic compound and its crystal structure with appropriate reference for that fact, and Table II, also represented hereinabove, gives a corresponding crystal structure for the various pure elements involved in the present invention. Accordingly, it should be apparent that the intermetallic compounds of aluminum and the transition metals described herein are truly intermetallic compounds and not alloys. This is demonstrated by the fact that the crystal structures, i.e., the three dimensional relationship of atoms in the crystalline solid of these compounds, are different from those of the pure metals or alloys.

It should also be understood that the prior art has almost universally avoided the use of intermetallic compounds in connection with semiconductor fabrication, since they often comprise highly resistant phases which can adversely affect electrical and mechanical properties of the metal body.

The use of the intermetallic compounds has been found to be particularly advantageous, however, in connection with the formation of Schottky barrier junctions described herein since intermetallic compounds of both the aluminum rich phase and transition metal rich phase are available. By selection of either the aluminum rich phase or the transition metal rich phase, a Schottky barrier junction having a barrier height close to the barrier height of aluminum or close to the barrier height of the transition metal can be preselected, with the junction formed exhibiting characteristics which are much better than those normally available through formation of junctions utilizing pure aluminum or the pure transition metal or alloys thereof.

In the preferred embodiment, the intermetallic compound selected was the aluminum rich phase of tantalum represented by the chemical formula $TaAl_3$. At least one other tantalum-aluminum intermetallic compound is recognized, i.e., that represented by the chemical formula $Ta_2Al$ which corresponds to a tantalum rich phase.

In fabricating a device such as that represented in FIG. 1 a silicon substrate of N-type silicon having a doping level of about $3 \times 10^{16}$ atoms/cc was utilized. The selection of the appropriate doping level is significant in that it determines whether an ohmic contact or a Schottky barrier contact is formed. This is well recognized in the art. It is also well recognized that semiconductor substrates other than silicon could be utilized.

Referring now to FIGS. 1 and 2, after the usual cleaning operations, an insulating layer, such as a layer of silicon dioxide 14 followed by a layer of silicon nitride 16 is formed on the upper surface of silicon substrate 12 by a suitable method, such as by oxidation. Holes are then etched in the silicon dioxide layer at appropriate locations which represent the desired locations for Schottky barrier contacts, to expose the silicon in those regions in the usual fashion.

The substrate or substrates are then loaded into a standard evaporator as indicated in Step 30 of FIG. 2. The evaporation system is evacuated using a suitable vacuum pump for an extended period of time with particular emphasis to outgassing the walls of the evaporator to reduce all possible oxygen contamination during evaporation. Oxygen contamination in the evaporation step can cause problems since oxidation of the aluminum or the transition metal can reduce the rate (or prevent) the formation of the intermetallic compound. Metallic evaporation sources, aluminum and the transition metal selected, should be of high purity.

The evaporator is pumped down to a relatively low pressure, i.e., $5 \times 10^{-7}$ Torr as indicated in Step 30. Pressures higher than $5 \times 10^{-6}$ Torr are usually unsatisfactory because of the liklihood of oxygen contamination.

A transition metal layer of tantalum about 1,000 Å thick is then evaporated onto the substrate while maintaining a pressure of about $5 \times 10^{-6}$ Torr as indicated in Step 32. It is preferred to have the transition metal evaporated quite slowly to produce a fairly fine grain structure. The preferred rate for evaporation of tantalum is about 20 Å per second. The tantalum layer is an intermediate layer which is converted to aluminum-tantalum intermetallic state by annealing, as described hereinafter. Accordingly, the tantalum layer is not represented in FIG. 1.

After deposition of the tantalum, a 10,000 Å layer of aluminum, such as layer 20 in FIG. 1, is evaporated on the substrate without breaking vacuum. The preferred evaporation rate for aluminum layer 20 is 60 Å per second. Thus, it is also important to have a fine aluminum grain structure.

The specific evaporation technique utilized can be any suitable one such as that achieved through conventional E-beam and/or heated filament evaporation. The evaporation is usually conducted without substrate heating.

Following the evaporation, photoresist is applied to the substrate in conventional fashion, and etching is utilized to define conductive lands for the individual Schottky contact regions.

This is accomplished by etching away the aluminum with conventional chemical processing using $H_3PO_4$ and $HNO_3$ to expose the tantalum layer. The tantalum layer is then etched away with $HNO_3$—$Hf$—$H_2O$ chemical etchant, again in conventional fashion. The photoresist is then removed in preparation for the annealing step.

Annealing step 36 is carried out in a closed furnace with a suitable atmosphere, such as nitrogen, for example. The purpose of annealing is to heat treat the wafer for a time-temperature combination sufficient to form the aluminum-transition metal intermetallic compound. The temperature and time required varies depending upon the transition metal selected and the specific aluminum-transition metal compound desired. The minimum temperature required to produce compound formation can be estimated from the melting point of the various phases.

Experiments have shown that intermetallic compound formation starts at approximately one-third to one-fourth of the melting point of the transition metal compound selected. It should also be recognized, that in the preferred embodiment sufficient aluminum will diffuse through the metal layer upon annealing so that the entire layer of transition metal will be consumed or converted to intermetallic compound. However, all that is essential to create a satisfactory junction is to convert a sufficient amount of transition metal whereby a monolayer of aluminum-transition metal intermetallic compound is formed at the silicon surface. In the case of aluminum-tantalum, this monolayer could be as thin as 50 Å, provided that it is free from discontinuities. In the preferred embodiment, the aluminum-tantalum intermetallic layer is of the order of 100 Å–1000 Å thick.

In the preferred embodiment the 100 A or greater thickness is attained by annealing at 500° C. for about one hour. Experiments have shown that heating for a longer time at a lower temperature will fully convert the tantalum to the desired intermetallic compound. For example, heating at 450° for three hours would accomplish substantially the same degree of conversion. Accordingly, a workable range of annealing time versus temperature for annealing tantalum is as follows: At 400° C. anneal temperature for one hour or more a detectable amount of $TaAl_3$ is formed based upon observable shifts in the barrier height of Ta. A lower limit for anneal temperature is believed to be 300° C. at which no changes in Ta barrier height are expected due to $TaAl_3$ formation.

Although the embodiment described hereinbefore was comprised of an aluminum-tantalum intermetallic compound it should be recognized that other transition metals such as zirconium, hafnium, niobium, titanium and nickel are equally suitable. Thus, the intermetallic compounds of each of these metals with aluminum represent high melting point structures with high stability. This implies that the intermetallic reaction, upon annealing, with these metals is usually localized at the grain boundaries since lattice diffusion is low for high melting point compounds.

Experimental tests have shown that the barrier height of the Schottky barrier junctions formed with the above transition metals correspond generally to the barrier height of the transition metal before annealing and are close to the barrier height of the aluminum after annealing, in instances where the aluminum rich phase of the intermetallic compound is selected. The thermal stabilities of these Schottky barrier junctions also correspond generally with the thermal stability of the high melting point compounds.

The selection of the particular six transition metals listed as suitable for Schottky barrier junction formation with intermetallics is based upon a figure of merit calculated according to Raynor's formula where (1) $I = T \times 10^4 / (100 T_p + (T_Q - T_p) \cdot X)$ where $T_Q > T_p$ melting point of pure Q, P; where T=melting point of the compound and X equals the mean composition in atomic % of Q. Table III below represents the figure of merit calculated for the six compounds represented as suitable for excellent Schottky barrier junctions. It should be recognized that other common Schottky materials such as platinum and chromium have lower figures of merit and, therefore, are less suitable for Schottky barrier junctions with aluminum transition metal intermetallic compounds.

TABLE III

| Metal Phase | Melting Point T° K. | Stability Index (I) |
|---|---|---|
| $TiAl_3$ | 1613 | 134 |
| $TaAl_3$ | 1973 | 135 |
| $ZrAl_3$ | 1853 | 150 |
| $HfAl_3$ | 1700 | 140 |
| $NbAl_3$ | 1750 | 135 |
| $NiAl_3$ | 1127 | 119 |

An alternate fabrication method is possible for producing Schottky barrier junctions by sputter deposition of a preselected transition metal-aluminum intermetallic compound on the semiconductor surface.

For example, referring now to FIG. 3, a particular sputter deposition process will be described for tantalum-aluminum intermetallic compounds. After cleaning, the substrate is loaded within a standard sputtering chamber which is evacuated to $3 \times 10^{-7}$ Torr. It is important that the chamber be evacuated to an atmosphere approximating the above pressure. The chamber is then backfilled to a pressure of $5 \times 10^{-4}$ Torr with ultra pure argon or a similar atmosphere. A target is selected of the desired transition metal-aluminum intermetallic compound. In step 42 a TaAl$_3$ target of high purity is selected—and cold RF sputtering is effected within the chamber at a rate of about 100 Å per minute until a layer about 1,000 Å in thickness of TaAl$_3$ intermetallic compound is deposited upon the substrate.

In step 44, the substrate is then loaded into an evaporator for deposition of an aluminum layer. The evaporator is, as before, evacuated to $5 \times 10^{-6}$ Torr and a layer of aluminum of about 10,000 Å thick is deposited at a rate of 30–60 Å/sec.

The layered structure is then processed to define conductive lands for the individual Schottky contacts by applying photoresist and processing in the usual fashion. For example, the aluminum is etched away with conventional chemical processing using H$_3$PO$_4$ and HNO$_3$ to expose the tantalum-aluminum layer. The tantalum-aluminum layer is then etched with HNO$_3$—HF—H$_2$O etchant down to the silicon substrate surface. The photoresist is then removed in preparation for an annealing step.

In the preferred embodiment, annealing is carried out at 450° C. for one hour in a conventional heating furnace. This is essential since the sputtering operation was a cold sputtering step. The annealing serves to insure that the tantalum-aluminum layer is fully converted to intermetallic compounds. It is believed that the use of a hot sputtering technique in deposition of the intermetallic layer would eliminate the necessity for an annealing step. However, even with the use of a hot sputtering technique, an annealing step would be of value in a production process to insure complete conversion of the aluminum-tantalum layer to the intermetallic lattice structure whereby an optimum junction is formed.

The process described hereinbefore could be utilized with the other metals mentioned herein, and would result in a structure such as that shown in FIG. 1, with assurance that no unconsumed metal would remain overlying the intermetallic layer. Furthermore, the sputtering technique permits more efficient process control over the thickness and composition of the intermetallic layer and makes it possible to eliminate discontinuities.

It should be recognized that gold could be utilized rather than aluminum in the formation of excellent Schottky barrier contacts of the type fabricated using the methods described herein.

The following examples are included merely to aid in the understanding of the invention and variations may be made by one skilled in the art without departing from the spirit and scope of the invention.

EXAMPLE 1

Sixty Schottky barrier junctions were formed of a TaAl$_3$ intermetallic compound utilizing the evaporation processing technique described hereinbefore. The substrate utilized for the devices was N+ silicon having an epi layer on the surface thereof doped to a level of $3 \times 10^{16}$ atoms/cc.

After cleaning, an insulating layer was formed thereon comprising successive layers of silicon dioxide and silicon nitride deposited by conventional techniques. The substrate was then placed in an evaporator which was pumped down to a background pressure of $5 \times 10^{-7}$ Torr. A 1,000 Å layer of elemental tantalum was then deposited by evaporation while maintaining pressure in the chamber at a level of $5 \times 10^{-6}$ Torr. Following deposition of the tantalum, a layer of 10,000 Å thick of aluminum was deposited in the same system without breaking vacuum.

Following the deposition steps the silicon substrate was removed from the evacuation chamber and photoresist was applied and processed to define suitable conductive lands for the individual Schottky junctions. The aluminum was etched with H$_3$PO$_4$ and HNO$_3$ in chemical processing steps to expose the underlying tantalum layer. The tantalum layer was etched away with a suitable etchant, such as HNO$_3$—HF—H$_2$O, down to the silicon. The photoresist was then removed in preparation for annealing.

Annealing at a temperature of 500° C. for one hour was carried out in a furnace to fully react the aluminum and tantalum to the intermetallic state. The sixty devices on the wafer were measured before and after the annealing step and it was found that the mean barrier height shifted from about 0.5 electron volts to about 0.67 electron volts. Other electrical characteristics of the Schottky junctions were satisfactory and they exhibited good thermal stability after annealing.

EXAMPLE 2

Sixty Schottky barrier junctions were formed of zirconium-aluminum intermetallic compound represented by the chemical formula ZrAl$_3$ using the evaporative process described hereinbefore. The devices were fabricated by the same process as the devices of Example 1 with the exception of a difference in the annealing step since zirconium and tantalum have different melting temperatures. The devices were annealed at 450° C. for one hour to completely convert the zirconium-aluminum structure to the desired ZrAl$_3$ intermetallic lattice. Electrical measurements were taken before and after annealing which showed that the barrier heights were unstable as deposited and the barrier height had reached a level of 0.53 after annealing for one hour. Additional annealing at 450° C. for one hour produced an improvement in the barrier height to 0.68 with other electrical characteristics being satisfactory. The devices of Example 2 were similar to the devices of Example 1 in that in both instances, after annealing, the barrier height reached a level close to the level of a pure aluminum junction. However, in both cases the intermetallic junctions showed better thermal stability.

EXAMPLE 3

Sixty Schottky barrier junctions were formed of titanium-aluminum intermetallic compound represented by the chemical formula TiAl$_3$, again using the same evaporative steps described hereinbefore. The devices were annealed at a temperature of 400° C. for one hour. Before annealing the devices were found to be thermally unstable with a barrier height in the order of 0.5. After annealing the barrier height was measured to be 0.68 with good thermal stability. However, the devices fabricated of titanium were less suitable then the tantalum devices in that relatively high reverse current leakage was observed after anneal. It is believed that this leakage is probably due to the incorporation of titanium oxide at the silicon metal interface during metal deposition.

EXAMPLE 4

Sixty Schottky barrier junctions were formed of nickel aluminum in a metallic compound represented by the chemical formula NiAl$_3$, using the same evaporative steps described hereinbefore. The devices were annealed at a temperature of 400° C. for one hour and subsequently annealed again at 500° C. for an additional hour. Before annealing the devices were found to be relatively thermally stable with a barrier height in the order of 0.58. After the first annealing interval the barrier height was measured to be 0.66 and after the second annealing interval the barrier height had further increased to 0.74 with thermal stability still being observed. The devices fabricated of nickel were preferable to the devices fabricated of the other transition metals in that the deviation from theoretical ideal diode characteristics was smaller than the deviations observed for the other intermetallic structures. This indicates that the nickel aluminum diodes would be preferred for certain circuit design applications.

EXAMPLE 5

Sixty Schottky barrier junctions were fabricated of the tantalum-aluminum intermetallic compound represented by the chemical formula TaAl$_3$ by the sputtering process described hereinbefore. The devices were fabricated on an n+ silicon substrate having an epi layer with a doping level of $3 \times 10^{16}$ atoms/cc. As before, an insulating region of successive layers of silicon dioxide and silicon nitride deposited by conventional processing was utilized.

Openings were formed for the Schottky junctions and the substrate was placed in an evacuation chamber which was pumped down to $3 \times 10^{-7}$ Torr. The chamber was then backfilled to $5 \times 10^{-4}$ Torr with ultra pure argon. By RF sputtering a 1,000 Å film of tantalum aluminum was deposited from a target of tantalum-aluminum intermetallic compound representing the aluminum rich phase designated by the chemical formula TaAl$_3$. This deposition was carried out at the rate of 100 Å per minute for a period of about ten minutes.

After sputtering the substrate was loaded into an evaporator which was pumped down to $5 \times 10^{-6}$ Torr for deposition of aluminum. A layer of aluminum 10,000 Å thick was then deposited at a rate of 30-60 Å per second.

After deposition of the aluminum, the substrate was removed from the evaporator, and photoresist was applied and processed to define conductive lands for the individual Schottky junctions. The aluminum layer was etched away with H$_3$PO$_4$ and HNO$_3$ to expose the aluminum-tantalum layer. The aluminum-tantalum layer was then removed in the desired regions with HNO$_3$—HF—H$_2$O etchant. The photoresist was then removed in preparation for the annealing step.

Annealing was carried out for a period of one hour at 500° C. Measurements taken before annealing and after annealing showed that the barrier height of the aluminum-tantalum layer was 0.49 before annealing and rose to 0.64 after annealing. The thermal stability of the junctions was essentially the same both before and after the annealing.

We claim:

1. A method of fabricating a Schottky barrier contact comprising the steps of:
   forming an aluminum-tantalum layer on a monocrystalline silicon surface;
   annealing the structure at a temperature above about 400° C. for about one hour whereby the tantalum is converted to a layer of an intermetallic compound of the aluminum and tantalum to form said Schottky contact; and
   forming an electrical contact to the Schottky barrier contact.

2. A method for fabricating a Schottky barrier contact comprising the steps of:
   depositing a layer of tantalum onto a monocrystalline silicon surface by evaporation;
   depositing a layer of aluminum of said tantalum layer by evaporation;
   annealing the structure at a temperature above 300° C. whereby the tantalum is converted to a layer of an intermetallic compound of the aluminum and tantalum to form said Schottky barrier contact; and
   forming an electrical contact to the Schottky barrier contact.

3. A method for fabricating a Schottky barrier contact comprising the steps of:
   depositing a layer of aluminum-tantalum intermetallic compound represented by the chemical formula TaAl$_3$ onto a monocrystalline silicon surface by sputtering;
   annealing the structure at a temperature above 300° C. to form said Schottky contact; and
   forming an electrical contact to the Schottky barrier contact.

4. A method for fabricating a Schottky barrier contact comprising the steps of:
   forming a layer of transition metal onto a monocrystalline silicon surface, where the transition metal is selected from the group of tantalum, zirconium, hafnium, niobium, titanium, and nickel,
   forming a layer of aluminum or gold on top of the transition metal layer;
   annealing the structure at a temperature above 300° C. for a period of at least one hour whereby the transition metal is converted to a layer of an intermetallic compound of the aluminum and transition metal; and
   forming an electrical contact to the Schottky barrier contact.

5. The method of claim 2 wherein the evaporation steps are carried out at a pressure about $5 \times 10^{-6}$ Torr.

* * * * *